(12) United States Patent
Oshima et al.

(10) Patent No.: US 7,489,042 B2
(45) Date of Patent: Feb. 10, 2009

(54) STEM FOR OPTICAL ELEMENT AND OPTICAL SEMICONDUCTOR DEVICE USING THE SAME

(75) Inventors: Isao Oshima, Tokyo (JP); Shinichi Takagi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 265 days.

(21) Appl. No.: 11/324,804

(22) Filed: Jan. 4, 2006

(65) Prior Publication Data

US 2007/0120134 A1 May 31, 2007

(30) Foreign Application Priority Data

Nov. 30, 2005 (JP) ............... 2005-345724

(51) Int. Cl.
*H01L 33/00* (2006.01)
(52) U.S. Cl. ................. 257/781; 257/82; 257/E33.077
(58) Field of Classification Search .......... 257/81, 257/82, E33.077
See application file for complete search history.

(56) References Cited

U.S. PATENT DOCUMENTS

| 5,557,074 A | 9/1996 | Miyamoto et al. |
| 7,109,523 B2 * | 9/2006 | Ishimura ............... 257/81 |
| 2004/0060727 A1 | 4/2004 | Kojima et al. |
| 2005/0121684 A1 | 6/2005 | Aruga et al. |

FOREIGN PATENT DOCUMENTS

| JP | 06-029451 | 2/1994 |
| JP | 08-125259 | 5/1996 |
| JP | 2004-047830 | 2/2004 |
| JP | 2004-127963 | 4/2004 |

* cited by examiner

*Primary Examiner*—Leonardo Andújar
*Assistant Examiner*—Krista Soderholm
(74) *Attorney, Agent, or Firm*—Leydig, Voit & Mayer, Ltd.

(57) ABSTRACT

A stem for an optical element includes a base-like portion located on a portion of a package side surface of an eyelet, higher than the package side surface. A block is located on a surface of the base-like portion of the eyelet. An optical element mounting surface of the block projects outward, overhanging a side face of the base-like portion, close to lead electrodes which are inserted through holes of the eyelet, respectively, and sealed with sealing glass. High-frequency line substrates are located on the optical element mounting surface of the block, and Au films of the high-frequency line substrate are electrically connected to respective lead electrodes.

6 Claims, 8 Drawing Sheets

STEM FOR OPTICAL ELEMENT AND OPTICAL SEMICONDUCTOR DEVICE USING THE SAME

BACKGROUND OF THE INVENTION

1. Field of the Invention

The present invention relates to stems for an optical element and optical semiconductor devices using the same, and more particularly to a stem for an optical element to which an optical element for receiving/emitting a high-frequency signal used in optical communication or the like is mounted, and an optical semiconductor device using the same.

2. Description of the Related Art

In recent years, the broadband promotion in the communication has progressed and the public communication network using optical fibers has been spread. Along with these circumstances, it has been required more and more to inexpensively transmit a large quantity of information. In order to increase a quantity of information to be transmitted so as to meet such a demand, it is necessary to increase a transmission rate. Thus, the transmission rate has been progressively increased from 600 Mbps to 2.5 Gbps, and up to 10 Gbps.

Networks of the optical communication as a market have been spread not only to a main line system, but also to an access system such as an office or a home with an increase in transmission speed of such a device for optical communication as the background. Thus, high-speed operation, inexpensiveness and high efficiency are required for a light emitting/receiving device used in an optical transmission receiver.

Many optical devices use an inexpensive can package that has a coaxial shape in order to hold the cost inexpensive. Then, a package construction having a less propagation loss is required for such a can package as well.

A main body of the can package is called a stem. The stem includes a metallic disc called an eyelet, a several rod-like lead electrodes, and a heat sink called a block. The rod-like lead electrodes are sealed in a plurality of through holes provided in the eyelet with sealing glass and are adapted to propagate an electrical signal therethrough. The heat sink is mounted onto the disk surface of the eyelet and an optical element is bonded to the heat sink.

In order to reduce the high-frequency propagation loss as much as possible, it is necessary to connect the optical element and the lead electrodes with lead wires as short as possible. For this reason, a sub-mount is provided on one side face of the block, and the optical element is bonded to the vicinity of a central portion of the sub-mount. In addition, signal lines are provided on the sub-mount on both sides or one side of the optical element. Electrodes of the optical element are connected to the signal lines short lead wires, respectively, and also the signal lines are connected to the lead electrodes with short lead wires, respectively. As a result, the high-frequency propagation loss in the connection between the optical element and the lead electrodes is reduced as much as possible.

In terms of the high-frequency propagation loss when the signal is propagated through the lead electrodes, the high-frequency propagation loss in the glass sealing portions between the through holes of the eyelet and the lead electrodes is reduced as much as possible by properly performing the impedance matching in the glass sealing portions. However, the impedance matching is hardly properly performed in portions, of the lead electrodes, which project from the eyelet in some cases.

The lead electrodes and the block as GND are separated from each other through air having a small dielectric constant. Hence, in order to reduce the high-frequency propagation loss in the projecting portions, of the lead electrodes, which project from the surface of the eyelet as much as possible, it is necessary that the lead electrodes and the block be provided so as not to come into contact with each other, but so as to come close to each other as much as possible.

However, in order to reduce the high-frequency propagation loss in the lead electrodes and the eyelet, the sealing glass to be provided in the through holes are injected into the through holes to be solidified until it becomes flush with the disc surface of the eyelet. At this time, the liquid sealing glass is drawn up in its portions contacting the surfaces of the lead electrodes due to its surface tension, forms meniscuses depending on the wettability of the material of the lead electrodes, and is solidified while holding the meniscuses.

For this reason, even if being made close to the lead electrodes, the block interferes with the projecting portions of the solidified sealing glass, formed due to the meniscuses of the sealing glass in the peripheries of the lead electrodes, and a distance between the block and the lead electrodes cannot be sufficiently reduced in some cases. Thus, the high-frequency propagation loss increases in some cases as the transmission rate of the signal increases.

Such methods of known examples are the following. That is to say, the impedance in the lead electrode and the block is made close to a given value, and the interference between the block and the projecting portion formed due to the meniscus of the sealing glass with which the lead electrode is sealed is avoided.

One of the known examples is as below. A coaxial hole of a block through which a lead electrode is made to completely extend is formed so as to have a smaller diameter than that of a through hole of an eyelet. In addition, in a portion where the coaxial hole of the block and the through hole of the eyelet are coupled to each other, an inner surface of the coaxial hole of the block is formed into a tapered surface in order to avoid interference with a projecting portion formed due to a meniscus. Refer to Japanese Patent Application Laid-Open No. 2004-127963, paragraphs [0009] to [0013], and FIGS. 1, 2 and 3 for example.

In addition, another known example is the following example of a coaxial line for a package. That is to say, a through hole is bored through a metal wall corresponding to an eyelet. The through hole has an outer end with a larger diameter than that of its inner end and a lead is inserted through the through hole. In addition, a sealing plate for covering an opening portion, of the through hole inner end, opening in a boundary portion between the through hole inner end and the through hole outer end is provided in the boundary portion therebetween, and the sealing plate is sealed in the through hole outer end with glass. Thus, the glass is prevented from being stuck to a lead peripheral surface. Refer to Japanese Patent Application Laid-Open No. 6-29451, paragraphs [0035] to [0042], and FIG. 2 for example.

Moreover, still another known example is disclosed in which a stem block having a recess stepped portion below a surface that a semiconductor laser diode is fixed is formed integrally with the stem base, and the recess having such a size that at least a part of a photodiode fixed to the stem base intrudes thereto. Refer to Japanese Patent Application Laid-Open No. 8-125259 for example.

Furthermore, yet another known example is disclosed in which signal pins mounted to a stem with a dielectric body is brazed to strip differential signal lines on a micro-strip differential line substrate provided on a surface of the stem. In the case of this example, a surface of the dielectric material with which the signal pins are mounted is formed in a position lower than that of the surface of the stem. Refer to Japanese Patent Application Laid-Open No. 2004-47830, paragraphs [0049] to [0051], and FIGS. 5 and 6 for example.

However, for the purpose of providing an inexpensive stem for an optical element, it is very important to simplify the manufacturing process thereof. The technique as shown in one of the above-mentioned known examples in which for example, the coaxial holes through which the lead electrodes are made to extend completely are provided in the block mounted on the eyelet, the distance to the lead electrodes is precisely ensured, and moreover the block having the complicated shape is formed such that the inner surface of the coaxial hole is formed into the tapered surface leads to an increase in manufacturing cost.

Likewise, the technique in which the stepped holes having the different inside diameters are formed, and the sealing plate is provided in the boundary portion between the through hole inner end and the through hole outer end, or the stem block having the recess stopped portion is formed integrally with the stem base also leads to an increase in manufacturing cost. Then, there is encountered such a problem that it becomes difficult to provide an inexpensive stem for an optical element in some cases.

SUMMARY OF THE INVENTION

The present invention has been made in order to solve the above-mentioned problems, and it is therefore a first object of the present invention to construct an inexpensive stem for an optical element that has a less high-frequency propagation loss.

It is a second object of the present invention to provide an inexpensive optical semiconductor device that has a less high-frequency propagation loss.

According to one aspect of the invention, there is provided a stem for an optical element according to the first embodiment of the present invention comprises: a substrate having a first principal surface and a second principal surface that are opposite with each other, a through hole perfectly extending through the first and second principal surfaces, and a base-like portion provided on one portion of the first principal surface so as to be higher than the first principal surface; a lead electrode inserted through the through hole of the substrate, and fixed to an inner surface of the through hole and sealed with an insulator, the lead electrode projecting from the first principal surface side and the second principal surface side of the substrate; and a stand provided on a surface of the base-like portion of the substrate, the stand having one side face facing a side face of the lead electrode, the one side face being close to the side face of the lead electrode and projecting outward in a eaves-like shape with respect to a side face of the base-like portion.

Accordingly, in the stem for an optical element according to the present invention comprises the base-like portion which is higher than the first principal surface of the substrate, and one side face of the stand provided on the base-like portion projects outward in the eaves-like shape with respect to the side face of the base-like portion.

Hence, the one side face of the stand can be suitably made close to the lead electrode without the interference between the projecting portion in the peripheries of the lead electrode formed due to the meniscus of the sealing glass and the stand. Moreover, the processing for providing the base-like portion on the substrate is simply performed and thus no complicated processing is required for the stand. As a result, the manufacturing cost can be sufficiently suppressed. In its turn, it is possible to construct the inexpensive stem for an optical element that has a less high-frequency propagation loss.

According to another aspect of the invention, there is provided an optical semiconductor device according to the present invention comprises: a substrate having a first principal surface and a second principal surface that are opposite with each other, a through hole perfectly extending through the first and second principal surfaces, and a base-like portion provided on one portion of the first principal surface so as to be higher than the first principal surface; a lead electrode inserted through the through hole of the substrate, and fixed to an inner surface of the through hole and sealed with an insulator, the lead electrode projecting from the first principal surface side and the second principal surface side of the substrate; a stand provided on a surface of the base-like portion of the substrate, the stand having one side face facing a side face of the lead electrode, the one side face being close to the side face of the lead electrode and projecting outward in a eaves-like shape with respect to a side face of the base-like portion; and an optical element provided on the stand, the optical element having a signal terminal connected to the lead electrode.

Accordingly, in the optical semiconductor device according to the present invention comprises the inexpensive stem for an optical element that has a less high-frequency propagation loss.

Hence, it is possible to provide the inexpensive optical semiconductor device having the less high-frequency propagation loss.

Other objects and advantages of the invention will become apparent from the detailed description given hereinafter. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

In all figures, the substantially same elements are given the same reference numbers.

DESCRIPTION OF THE PREFERRED EMBODIMENTS

While a stem for an optical element will hereinafter be described in detail by giving a stem for a semiconductor laser diode as an example, a stem may be used for any other suitable light receiving element or light emitting element by way of another example.

First Embodiment

Figure 1:
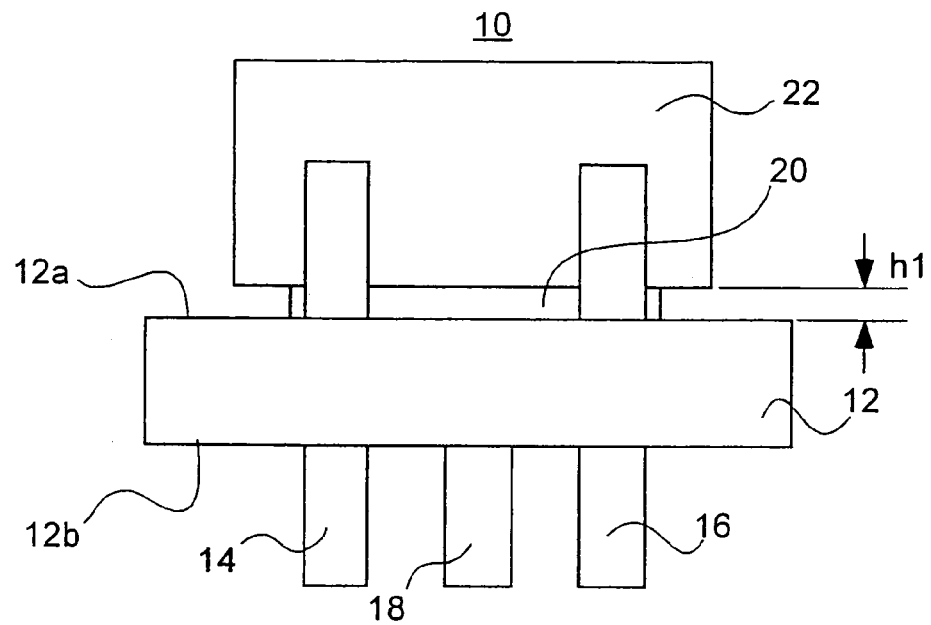
FIG. 1 is a front view of a stem for a laser diode according to one embodiment of the present invention.
Figure 2:
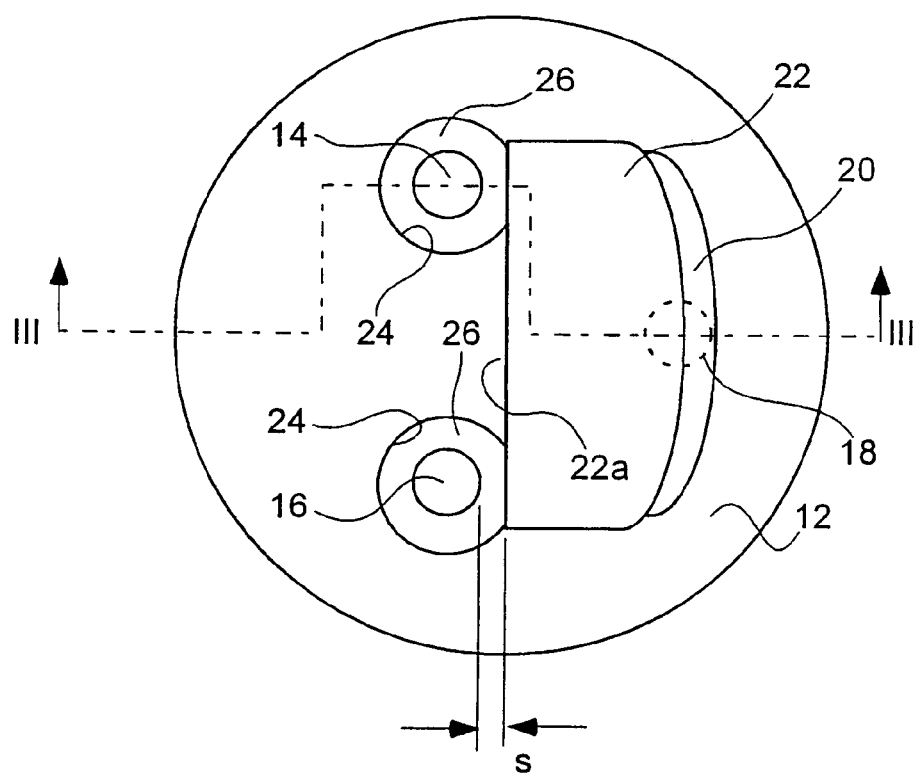
FIG. 2 is a plan view of the stem for an LD shown in FIG. 1.
Figure 3:
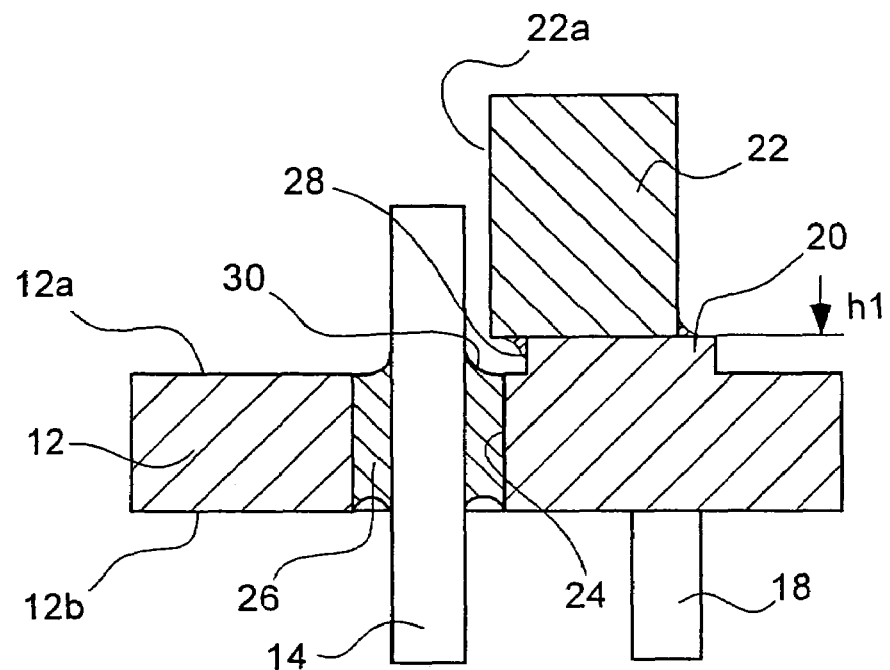
FIG. 3 is a cross sectional view of the stem for an LD taken on line III-III of FIG. 2.

FIG. 1 is a front view of a stem for a laser diode (hereinafter referred to as "an LD") according to one embodiment of the present invention. FIG. 2 is a plan view of the stem for an LD shown in FIG. 1. FIG. 3 is a cross sectional view of the stem for an LD taken on line III-III of FIG. 2. In the following figures, the same reference numerals designate the same or corresponding portions.

As shown in FIG. 1, a stem 10 for an LD includes an eyelet 12 used as a substrate, a plurality of rod-like lead electrodes 14 and 16, and a rod-like grounding lead 18. The plurality of rod-like lead electrodes 14 and 16 perfectly extend through a package side surface 12a used as a first principal surface of the eyelet 12 and an outer surface 12b used as a second principal surface of the eyelet 12 to project from a side of the package side surface 12a and a side of the outer surface 12b. Also, the grounding lead 18 is joined to the outer surface 12b of the eyelet 12. Moreover, the stem 10 for an LD further includes a base-like portion 20, and a block 22 used as a stand provided on a surface of the base-like portion 20. The base-like portion 20 rises from one portion of the package side face 12a of the eyelet 12 so as to be have a height h1 higher than the package side face 12a.

Each of the eyelet 12, the lead electrodes 14 and 16, the grounding lead 18, and the block 22 is made of, e.g., kovar (an alloy of iron, nickel and cobalt).

As shown in FIG. 2, the eyelet 12 has a disc-like shape having a diameter of about 5 mm and a thickness of about 0.7 mm to about 1.5 mm, for example. The height, h1, of the base-like portion 20 shown in FIG. 1 from the package side face 12a is in the range of about 0.3 mm to about 0.4 mm. Each of the lead electrodes 14 and 16 has a cylindrical shape having a diameter of about 0.4 mm to about 0.5 mm.

The eyelet 12 having such a base-like portion 20 is excellent in mass productivity since it can be readily manufactured through pressing. Thus, its manufacturing cost can be sufficiently reduced.

As shown in FIG. 2, through holes 24 are provided to extend perpendicularly to the package side face 12a and the outer surface 12b as the disc surfaces of the eyelet 12 and pass through the eyelet 12. The lead electrodes 14 and 16 are inserted through the through holes 24, respectively, and fixed in the through holes 24, respectively, with sealing glass 26 used as an insulator for sealing.

A diameter of each of the through holes 24 is about 1 mm. Then, the diameter of each of the through holes 24 is determined so that the impedance matching in portions where the lead electrodes 14 and 16 are sealed in the through holes 24 with the sealing glass 26 may be properly performed depending on the diameter of each of the lead electrodes 14 and 16, and a relative dielectric constant of the sealing glass 26 to reduce the high-frequency propagation loss.

The block 22 is mounted so that its optical element mounting surface 22a used as one side face faces side faces, being cylindrical surfaces, of the lead electrodes 14 and 16 respectively, to each other. In the stem 10 for an LD of this embodiment, each of projecting portions, of the lead electrodes 14 and 16, which project from the package side face 12a has such a height as to exceed the middle of the height of the block 22 so that the projecting portions can be connected to the LD to be bonded to the optical element mounting surface 22a with wires as short as possible.

Then, preferably, a distance s between the optical element mounting surface 22a and the side faces of the lead electrodes 14 and 16 is reduced as much as possible to the extent in which the optical element mounting surface 22a, and the side faces of the lead electrodes 14 and 16 do not come into contact with each other. The reason for this is that only air exists between the optical element mounting surface 22a, and the side faces of the lead electrodes 14 and 16, and its relative dielectric constant is smaller than that of the sealing glass 26. In particular, when the propagation speed of the signal reaches 10 Gbps, desirably, the distance, s, is made equal to or shorter than 0.4 mm in terms of the reduction of the high-frequency propagation loss.

As can be seen from FIG. 3, a side face 28 of the base-like portion 20 of the eyelet 12 adjacent to the through holes 24 is slightly apart from inner edges of the two through holes 24. This construction is necessary for formation of the base-like portion 20 through pressing.

In addition, the side face 28 of the base-like portion 20 extends along a common tangential line of the inner edges of the two through holes 24. However, the side face of the base-like portion 20 of the eyelet 12 does not necessarily extend along the common tangential line of the inner edges of the two through holes 24. In this case, the block 22 needs only to be stably mounted onto the base-like portion 20.

In addition, as can be seen from FIG. 3, the liquid sealing glass 26 with which the lead electrode 14 is sealed is filled in the through hole 24 by the full-length thereof. For this reason, the sealing glass 26 is drawn up due to its surface tension in a portion contacting the surface of the lead electrode 14. As a result, the sealing glass 26 forms a meniscus depending on the wettability of the material of the lead electrode 14, and is solidified while holding the meniscus so formed to form a projecting portion 30 which rises more upward than the package side surface 12a.

However, in the stem 10 for an LED, since the block 22 is mounted to the surface of the base-like portion 20, the optical element mounting surface 22a of the block 22 can be made to project outward in an eaves-like shape with respect to the side face 28 of the base-like portion 20. For this reason, the block 22 can be made close to a side face of the lead electrode 14 without interfering with the projecting portion 30 of the sealing glass 26 so that a suitable distance being close to the side face of the lead electrode 14 can be provided. The distance s between the optical element mounting surface 22a and the side face of the lead electrode 14, for example, can be set to 0.4 mm or less which is required when the propagation speed of the signal reaches 10 Gbps. This can also apply to the relationship between the lead electrode 16 and the side face 22a of the block 22.

At that, the block 22 and the surface of the base-like portion 20 are joined to each other with a brazing material for example.

In the stem 10 for an LD, the package side surface 12a of the eyelet 12 has the base-like portion 20, the block 22 is mounted to the base-like portion 20, and the side face 22a of the block 22 projects outward in the eaves-like shape with respect to the side face 28 of the base-like portion 20. As a result, the side face 22a of the block 22 can be suitably made close to each of the lead electrodes 14 and 16.

This suitably yields the suitable impedance matching in the lead electrode 16 projecting from the package side surface 12a. As a result, it is possible to reduce the high-frequency propagation loss in the lead electrode 16 projecting from the package side surface 12a.

In addition thereto, the optical element mounting surface 22a of the block 22 can be made to project outward in the eaves-like shape with respect to the side face 28 of the base-like portion 20. Hence, the lead electrodes 16 projecting from the package side surface 12a and the block 22 can be made close to each other without the interference of the block 22 with the projecting portions 30 of the sealing glass 26. Consequently, the sealing glass 26 can be injected into each of the through holes 24 by the full-length thereof, which results in that it is possible to suitably suppress the high-frequency propagation loss in the lead electrodes 14 and 16, and the eyelet 12.

Moreover, the adoption of such a simple construction that the base-like portion 20 is provided on the package side surface 12a results in that the eyelet 12 can be readily manufactured through pressing, the mass productivity is excellent, and the manufacturing cost can be sufficiently suppressed. Hence, it is possible to provide the inexpensive stem 10 for an LD.

As described above, the stem for an optical element according to the first embodiment of the present invention comprises: a substrate having a first principal surface and a second principal surface that are opposite with each other, a through hole perfectly extending through the first and second principal surfaces, and a base-like portion provided on one portion of the first principal surface so as to be higher than the first principal surface; a lead electrode inserted through the through hole of the substrate, and fixed to an inner surface of the through hole and sealed with an insulator, the lead electrode projecting from the first principal surface side and the second principal surface side of the substrate; and a stand provided on a surface of the base-like portion of the substrate, the stand having one side face facing a side face of the lead electrode, the one side face being close to the side face of the lead electrode and projecting outward in a eaves-like shape with respect to a side face of the base-like portion.

For this reason, the stem for an optical element according to the first embodiment of the present invention has the base-like portion which is higher than the first principal surface of the substrate, and one side face of the stand provided on the base-like portion projects outward in the eaves-like shape with respect to the side face of the base-like portion. Hence, the one side face of the stand can be suitably made close to the lead electrode without the interference between the projecting portion in the periphery of the lead electrode formed due to the meniscus of the sealing glass and the stand. Moreover, the processing for providing the base-like portion on the substrate is simply performed and thus no complicated processing is required for the stand. As a result, the manufacturing cost can be sufficiently suppressed. In its turn, it is possible to construct the inexpensive stem for an optical element that has a less high-frequency propagation loss.

Second Embodiment

Figure 4:
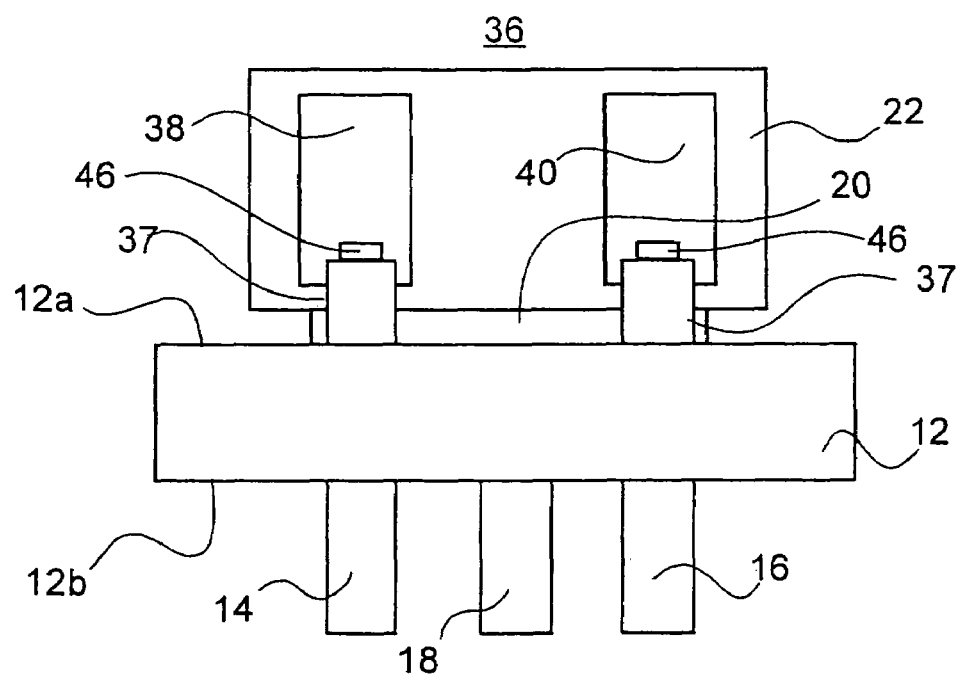
FIG. 4 is a front view of a stem for an LD according to one embodiment of the present invention.
Figure 5:
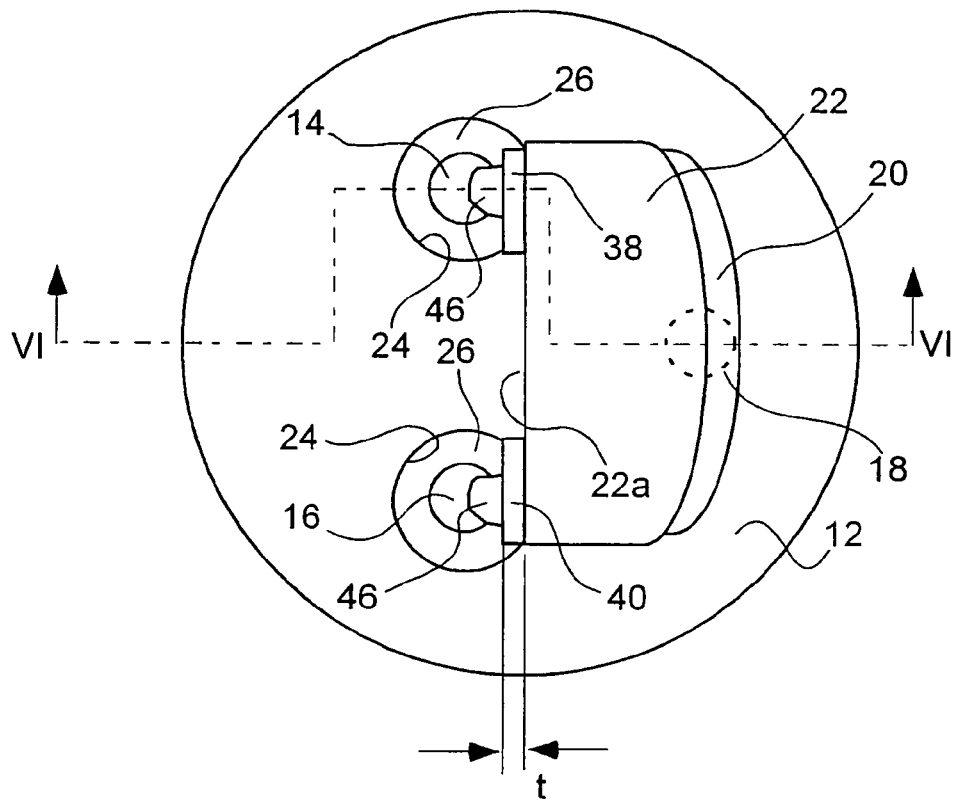
FIG. 5 is a plan view of the stem for an LD shown in FIG. 4.
Figure 6:
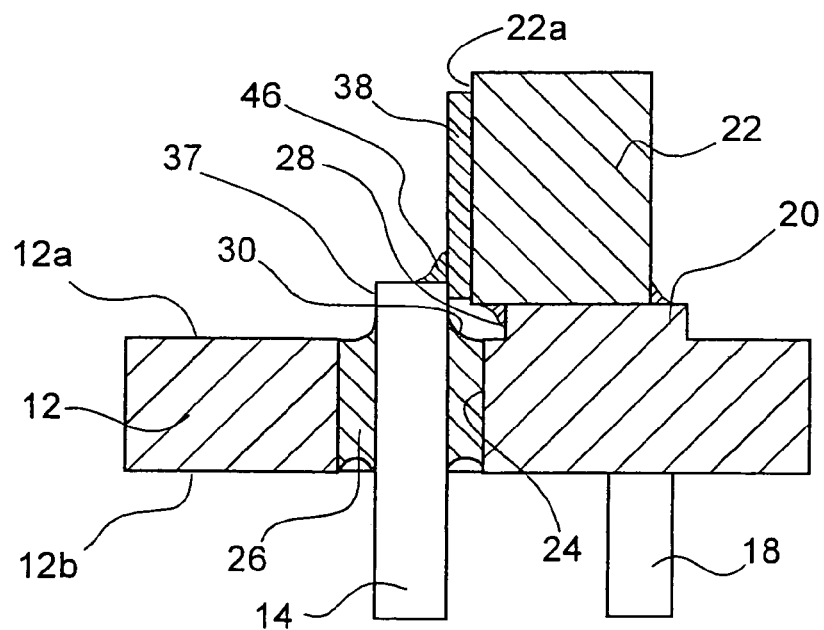
FIG. 6 is a cross sectional view of the stem for an LD, taken on line VI-VI of FIG. 5.

FIG. 4 is a front view of a stem for an LD according to one embodiment of the present invention. FIG. 5 is a plan view of the stem for an LD shown in FIG. 4. FIG. 6 is a cross sectional view of the stem for an LD taken on line VI-VI of FIG. 5.

As shown in FIG. 4, a stem 36 for an LD basically has the same construction as that of the stem 10 for an LD of the first embodiment. A first point of difference of the stem 36 for an LD from the stem 10 for an LD is the following. In the stem 10 for an LD, each of the projecting portions, of the lead electrodes 14 and 16, which project from the package side surface 12a of the eyelet 12 has such a height as to exceed the middle of the height of the block 22. On the other hand, in the stem 36 for an LD, a height, from the package side surface 12a of the eyelet 12, of each of projecting portions 37 of the lead electrodes 14 and 16 projecting from the package side surface 12a has only such a level as to slightly exceed the height of the base-like portion 20.

A second point of difference of the stem 36 for an LD from the stem 10 for an LD is the following. High-frequency line substrates 38 and 40 are provided on the optical element mounting surface 22a of the block 22. In addition, respective side faces of the projecting portions 37 of the lead electrodes 14 and 16 projecting from the package side surface 12a are brought into individual contact with corresponding one of the high-frequency line substrates 38 and 40 sandwiched between the lead electrodes 14 or 16 and the optical element mounting surface 22a of the block 22.

Other constructions of the stem 36 for an LD are the same as those of the stem 10 for an LD.

Figure 7:
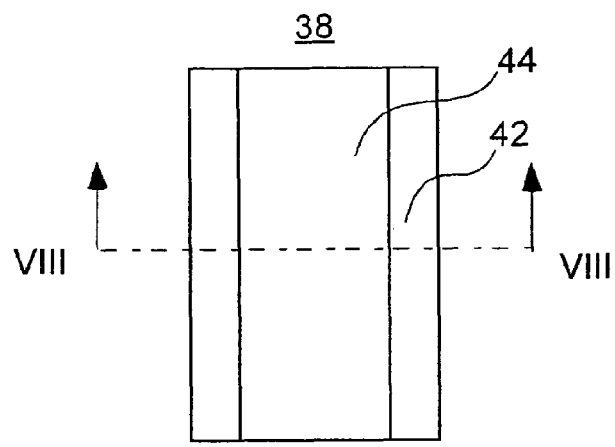
FIG. 7 is a plan view of a high-frequency line substrate used in the stem of an LD according to one embodiment of the present invention.
Figure 8:
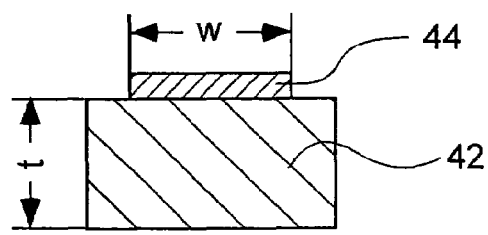
FIG. 8 is a cross sectional view of the high-frequency line substrate taken on line VIII-VIII of FIG. 7.

FIG. 7 is a plan view of a high-frequency line substrate used in the stem of an LD according to one embodiment of the present invention. FIG. 8 is a cross sectional view of the high-frequency line substrate taken on line VIII-VIII of FIG. 7.

In FIGS. 7 and 8, a dielectric substrate 42 of the high-frequency line substrate 38 is made of alumina or aluminum nitride for example. An Au film 44 as a signal line formed by sputtering for example is provided on the surface of the dielectric substrate 42. A width w of the signal line 44 falls within the range of about 0.6 mm to about 0.8 mm in correspondence to a diameter of each of lead electrodes of about 0.4 mm to about 0.5 mm. In addition, a thickness t of the dielectric substrate 42 depends on the width of the signal line 44 and a relative dielectric constant of the material of the dielectric substrate 42. When the width of the signal line 44 falls within the range of 0.6 mm to 0.8 mm, the thickness t of the dielectric substrate 42 falls within the range of about 0.1 mm to about 0.2 mm. A length of the high-frequency line substrate 38 is suitably determined depending on the size of the block 22. While the high-frequency line substrate 38 has been described here so far, this also applies to the high-frequency line substrate 40.

As shown in FIGS. 4, 5 and 6, the high-frequency line substrates 38 and 40 are provided on the optical element mounting surface 22a of the block 22 so that the Au films 44 face the projecting portions 37 of the lead electrodes 14 and 16, respectively. Also, the dielectric substrates 42 on the back surfaces of the Au films 44 are bonded to the optical element mounting surface 22a of the block 22. The Au films 44 of the high-frequency line substrates 38 and 40 are in contact with the projecting portions 37 of the lead electrodes 14 and 16, respectively. Moreover, in order to further stabilize the electrical connection as in the second embodiment, the projecting portions 37 of the lead electrodes 14 and 16, and the Au films 44 may be joined to each other with solder 46 (or gold bumps or the like).

Similarly to the case of the stem 10 for an LD of First Embodiment, the optical element mounting surface 22a of the block 22 projects outward in the eaves-like shape with respect to the side face 28 of the base-like portion 20. For this reason, the Au films 44 of the high-frequency line substrates 38 and 40 can be brought into contact with the projecting portions 37, of the lead electrodes 14 and 16, which project from the package side surface 12a without the interference of the block 22 with the projecting portions 30 of the sealing glass 26.

In the stem 36 for an LD, the projecting portions 37, of the lead electrodes 14 and 16, which project from the package side surface 12a are made considerably shorter than those in the stem 10 for an LD, and moreover, the Au films 44 of the high-frequency line substrates 38 and 40 are brought into direct contact with the projecting portions 37 of the lead electrodes 14 and 16. As a result, the dispersion in the effect of suppressing the high-frequency propagation loss is less, and thus the high-frequency propagation loss can be stably reduced.

In addition thereto, similarly to the stem 10 for an LD of the first embodiment, the optical element mounting surface 22a of the block 22 can be made to project outward in the eaves-like shape with respect to the side face 28 of the base-like portion 20. For this reason, without the interference of the block 22 with the projection 30 of the sealing glass 26, the Au films 44 of the high-frequency line substrates-38 and 40 can be brought into contact with the projecting portions 37, of the lead electrodes 14 and 16, which project from the package side surface 12a. In this case, the Au films 44 of the high-frequency line substrates 38 and 40 are such that the thickness of each of the dielectric substrates 42 is selected to suitably provide the impedance matching. As a result, since the sealing glass can be injected into each of the through holes 24 by the full-length thereof, the high-frequency propagation loss in the lead electrodes 14 and 16, and the eyelet 12 can also be suitably suppressed.

The high-frequency propagation loss from the projecting portion 37 projecting from the package side surface 12a of the eyelet 12 can be stably reduced as the general effect.

Moreover, since the base-like portion 20 on the package side surface 12a can be simply manufactured through the pressing of the eyelet 12, the mass productivity is excellent, and the manufacturing cost can be sufficiently suppressed. As a result, it is possible to provide the inexpensive stem 36 for an LD.

Incidentally, in the second embodiment, the height, from the package side surface 12a of the eyelet 12, of each of the projecting portions 37 of the lead electrodes 14 and 16 has only such a level as to slightly exceed the height of the base-like portion 20. However, even if the height of the base-like portion 26 becomes higher than that, from the package side surface 12a of the eyelet 12, of each of the projecting portions 37, the high-frequency line substrates 38 and 40 may be extended toward the side of the package side surface 12a of the eyelet 12 to come into contact with the projecting portions 37 of the lead electrodes 14 and 16. Hence, the height of the base-like portion 20 may be greater than the height, from the package side surface 12a of the eyelet 12, of each of the projecting portions 37, or vice versa.

In addition, while in the second embodiment both the high-frequency line substrates 38 and 40 are provided, either one of the high-frequency line substrate 38 or 40 may be provided in some cases.

As described above, the stem for an optical element according to the second embodiment of the present invention comprises: a substrate having a first principal surface and a second principal surface that are opposite with each other, a through hole perfectly extending through the first and second principal surfaces, and a base-like portion provided on one portion of the first principal surface so as to be higher than the first principal surface; a lead electrode inserted through the through hole of the substrate, and fixed to an inner surface of the through hole and sealed with an insulator, the lead electrode projecting from the first principal surface side and the second principal surface side of the substrate; a stand provided on a surface of the base-like portion of the substrate, the stand having one side face facing a side face of the lead electrode, the one side face being close to the side face of the lead electrode and projecting outward in a eaves-like shape with respect to a side face of the base-like portion; and a high-frequency line substrate provided on the one side face of the stand, the high-frequency line substrate having a dielectric substrate, and a signal line provided on a surface of the dielectric substrate the lead electrode and the signal line being electrically connected to each other; wherein the high-frequency line substrate is sandwiched between the lead electrode and the stand.

Then, the stem for an optical element according to the second embodiment of the present invention has a base-like portion which is higher than the first principal surface of the substrate, and the side face of the stand provided on the base-like portion projects outward in the eaves-like shape with respect to the side face of the base-like portion. Hence, the one side face of the stand can be suitably made close to the lead electrode without the interference between the projecting portion formed in the periphery of the lead electrode due to the meniscus of the sealing glass, and the stand. Moreover, the processing for providing the base-like portion on the substrate is simply performed, and thus no complicated processing is required for the stand. As a result, the manufacturing cost can be sufficiently reduced. In its turn, it is possible to construct the inexpensive stem for an optical element that has the less high-frequency propagation loss.

Third Embodiment

Figure 9:
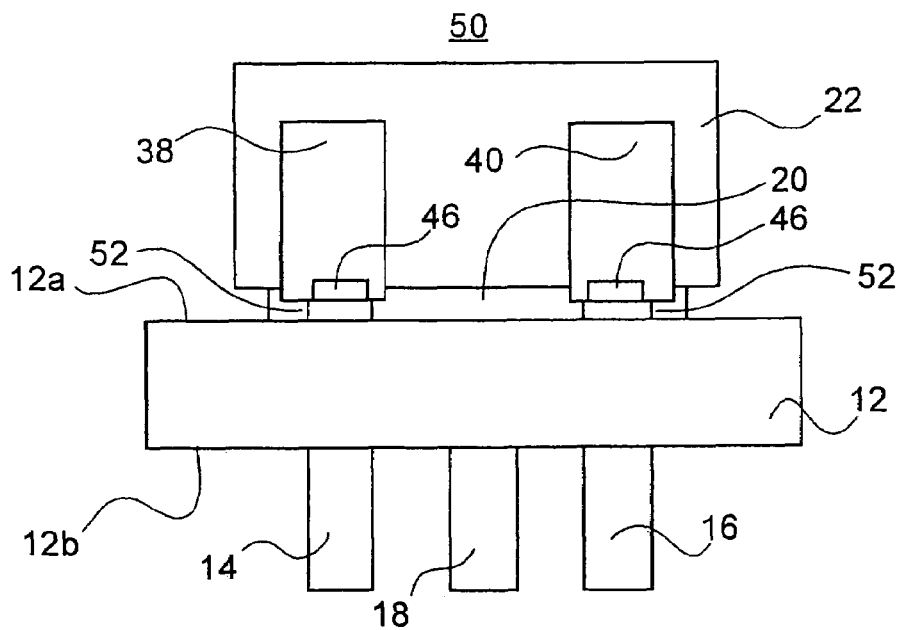
FIG. 9 is a front view of a stem for an LD according to one embodiment of the present invention.
Figure 10:
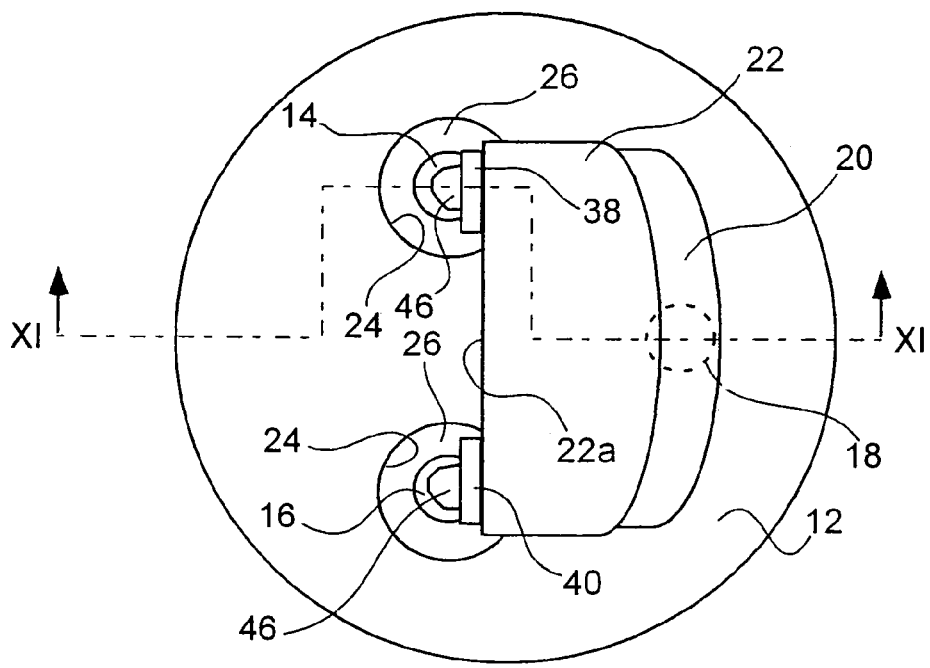
FIG. 10 is a plan view of the stem for an LD shown in FIG. 9.
Figure 11:
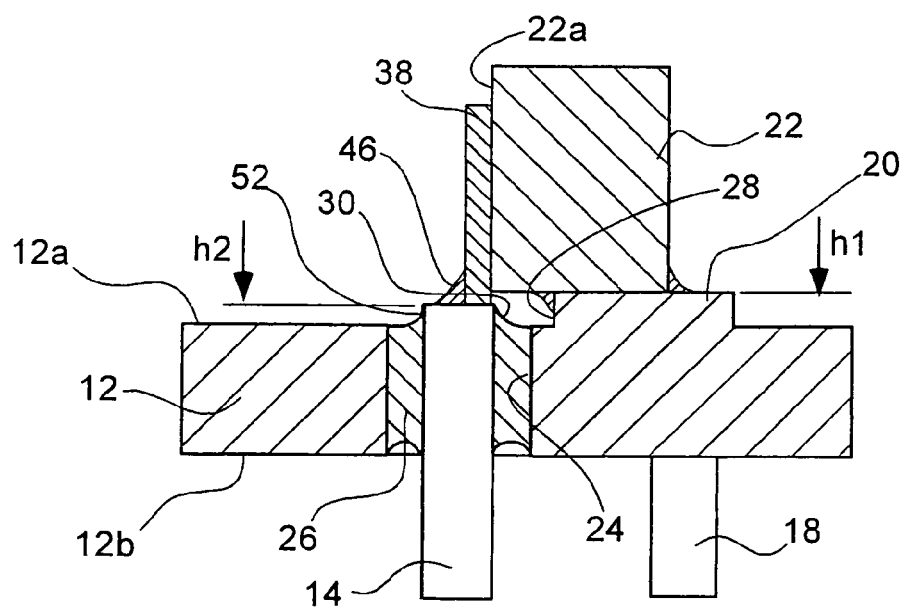
FIG. 11 is a cross sectional view of the stem for an LD taken on line XI-XI of FIG. 10.

FIG. 9 is a front view of a stem for an LD according to one embodiment of the present invention. FIG. 10 is a plan view of the stem for an LD shown in FIG. 9. FIG. 11 is a cross sectional view of the stem for an LD taken on line XI-XI of FIG. 10.

As shown in FIG. 9, a stem 50 for an LD basically has the same construction as that of the stem 36 for an LD of the second embodiment. A first point of difference of the stem 50 for an LD from the stem 36 for an LD is the following. In the stem 36 for an LD, each of the projecting portions 37, of the lead electrodes 14 and 16, which project from the package side surface 12a of the eyelet 12 has such a height from the package side surface 12a of the eyelet 12 as to slightly exceed the height of the base-like portion 20. On the other hand, in the stem 50 for an LD, each of projecting portions 52, of the lead electrodes 14 and 16, which project from the package side surface 12a of the eyelet 12 has only a height lower than that of the base-like portion 20.

Moreover, a second point of difference of the stem 50 for an LD from the stem 36 for an LD is the following. In the stem 36 for an LD, the side faces of the projecting portions 37 are brought into individual contact with each other with a corresponding one of the high-frequency line substrates 38 and 40 sandwiched between the projecting portions 37 and the optical element mounting surface 22a of the block 22. In the stem 50 for an LD, the high-frequency line substrates 38 and 40 are directly placed on the head surfaces of the projecting portions 52, respectively.

The other constructions of the stem 50 for an LD are the same as those of the stem 36 for an LD.

As shown in FIGS. 9 and 11, a height, h2, of each of the projecting portions 52, of the lead electrodes 14 and 16, which project from the package side surface 12a of the eyelet 12 is lower than the height, h1, of the base-line portion 20. The height, h2, is, e.g., about 0.1 mm. The height, h2, of about 0.1 mm is such a height that even when the sealing glass 26 is injected into each of the through holes 24 by the full-length thereof, the sealing glass 26 does not exceed the head surfaces of the projecting portions 52 to be drawn up due to its surface tension.

The high-frequency line substrates 38 and 40 are bonded to the optical element mounting surface 22a of the block 22 so as to be directly placed on the head surfaces of the projecting portions 52 of the lead electrodes 14 and 16, respectively. The head surfaces of the projecting portions 52, and the Au films 44 of the high-frequency line substrates 38 and 40 are joined to each other with the solder 46 for example (or Au bumps or the like).

In the stem 50 for an LD, the projecting portions 52, of the lead electrodes 14 and 16, which project from the package side surface 12a are further shorter than the projecting portion 37 of the stem 36 for an LD. For this reason, the high-frequency propagation loss in the projecting portions 52 of the stem 50 for an LD is further reduced as compared with the case of the projecting portions 37 of the stem 36 for an LD.

In addition, the projecting portions 52 of the lead electrodes 14 and 16 are joined to the Au films 44 of the high-frequency line substrates 38 and 40, respectively, with the solder 46 for example. Hence, the dispersion in the effect of suppressing the high-frequency propagation loss is reduced, and thus the high frequency propagation loss can be more stably reduced than that in the stem 36 for an LD.

In addition thereto, similarly to the case of the stem 36 for an LD, the high-frequency line substrates 38 and 40 can be directly placed on the head surfaces of the projecting portions 52 of the lead electrodes 14 and 16, respectively, without the interference of the block 22 with the projecting portions 30 of the sealing glass 26. As a result, since the sealing glass 26 can be injected into the through holes 24 by the full-length thereof, the high-frequency propagation loss in the lead electrodes 14 and 16, and the eyelet 12 can be suitably suppressed. In addition thereto, when the height of each of the head portions of the lead electrodes 14 and 16 are lower than that of the base-like portion 20, the positional correction can be made without the interference with the lead electrodes 14 and 16 by pressing the optical element mounting surface 22a. The dispersion in the positional precision of the optical element mounting surface 22a can be reduced through the positional correction by the press. In addition, since the irregularity of the optical element mounting surface 22a can also be corrected by the press, it becomes possible to stably mount components.

The high-frequency propagation loss due to the projecting portions 52 projecting from the package side surface 12a of the eyelet 12 can be further stably reduced as the general effect.

Moreover, the optical element mounting surface 22a of the block 22 can be made to project outward in the eaves-like shape with respect the side face 28 of the base-like portion 20. Hence, the high-frequency line substrates 38 and 40 can be directly placed on the head surfaces of the projecting portions 52 of the lead electrodes 14 and 16, respectively, without the interference of the block 22 with the projecting portions 30 of the sealing glass 26. Also, owing to adoption of the process for directly placing the high-frequency line substrates 38 and 40 on the head surfaces of the projecting portions 52 of the lead electrodes 14 and 16, respectively, the high-frequency line substrates 38 and 40 can be directly placed on the head surfaces of the projecting portions 52 of the lead electrodes 14 and 16 without requiring the severe size precision so much. For this reason, since the degree of freedom for the manufacture further increases, it becomes possible to manufacture the stem 50 for an LD at the manufacturing cost which is more inexpensive than that in the stem 36 for an LD shown in the second embodiment in which the high-frequency line substrates 38 and 40 are sandwiched between the projecting portions 37 of the lead electrodes 14 and 16, and the block 22.

At that, in the third embodiment, the description has been given of the case where the height of each of the projecting portions 52 of the lead electrodes 14 and 16 is lower than that of the base-like portion 20 so far. However, the height, from the package side surface 12a of the eyelet 12, of each of the projecting portions 52 may be higher than that of the base-like portion 20 in some cases.

In addition, in the third embodiment, the description has also been given of the case where in the stem 50 for an LD, the high-frequency line substrates 38 and 40 are directly placed on the head surfaces of the projecting portions 52, respectively, so far. However, instead of directly placing the high-frequency line substrates 38 and 40 on the head surfaces of the projecting portions 52 of the lead electrodes 14 and 16, respectively, the high-frequency line substrates 38, 40 may be directly placed at portions above the head surfaces of the projecting portions 52 and outside the outer peripheries of the lead electrodes 14, 16 so as not to be placed on the head surfaces of the projecting portions 52, respectively.

As described above, the stem for an optical element according to the third embodiment of the present invention further comprises: a high-frequency line substrate provided on the one side face of the stand, the high-frequency line substrate having a dielectric substrate, and a signal line provided on a surface of the dielectric substrate, the lead electrode and the signal line being electrically connected to each other; wherein a side face of said high-frequency line substrate facing a head surface of said lead electrode projecting from the first principal surface is provided above the head surface of said lead electrode.

In addition, the stem for an optical element according to the third embodiment of the present invention, wherein the side face of said high-frequency line substrate facing a head surface of said lead electrode projecting from the first principal surface is directly provided on the head surface of the lead electrode.

Hence, in the stem for an optical element according to the third embodiment of the present invention, the high-frequency propagation loss in the lead electrodes projecting from the first principal side of the substrate can be further stably reduced. As a result, it is possible to construct the more inexpensive stem for an optical element in which the high-frequency propagation loss is further stably reduced.

It should be noted that while the first to third embodiments have been described so far by giving the construction in which the number of lead electrodes is two, and the number of grounding leads is one as an example, the number of lead electrodes and the number of grounding leads are not limited thereto. That is, the number of lead electrodes may be one, or the grounding lead may not be grounded.

Fourth Embodiment

Figure 12:
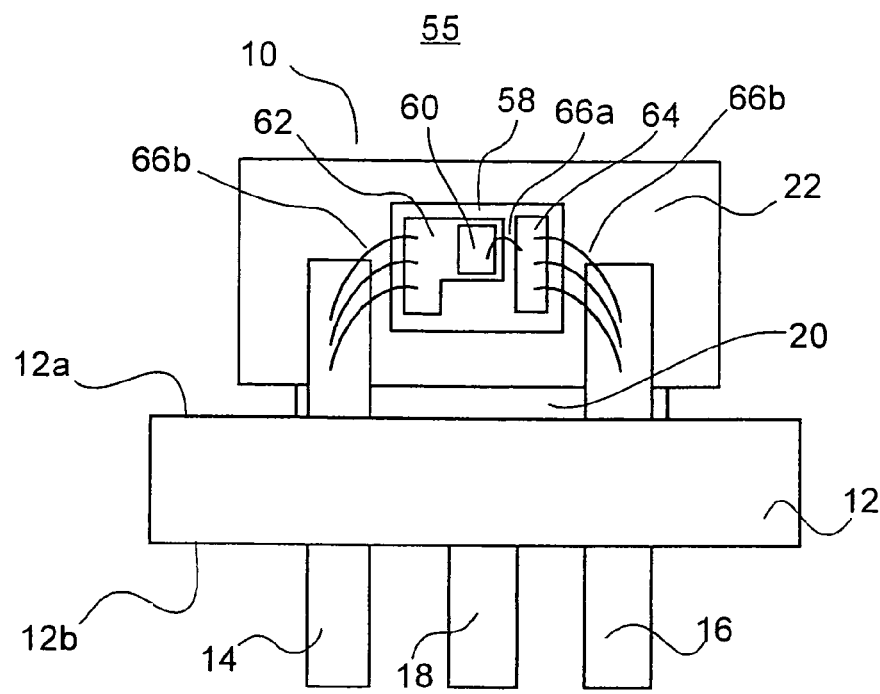
FIG. 12 is a front view of an optical semiconductor device according to one embodiment of the present invention.
Figure 13:
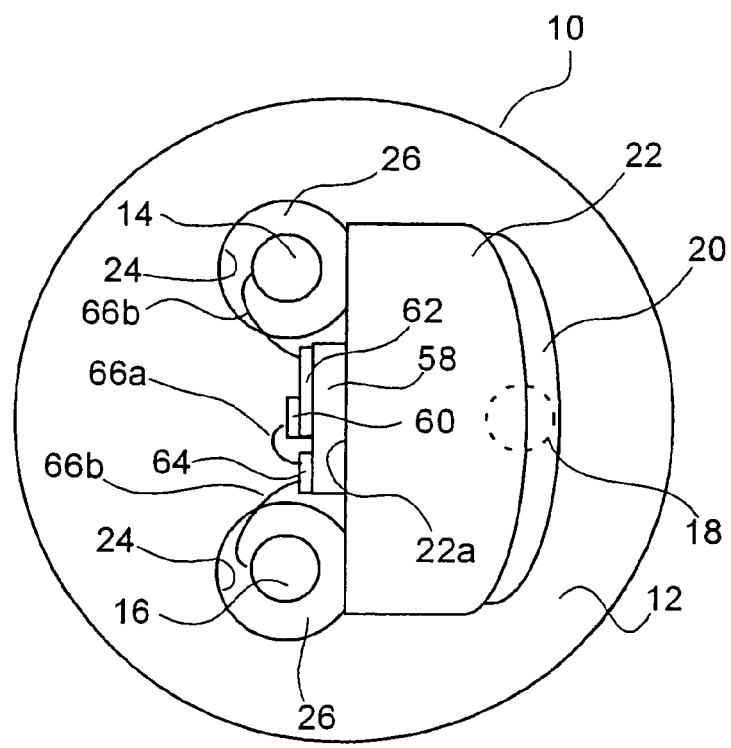
FIG. 13 is a plan view of the optical semiconductor device shown in FIG. 12.
Figure 14:
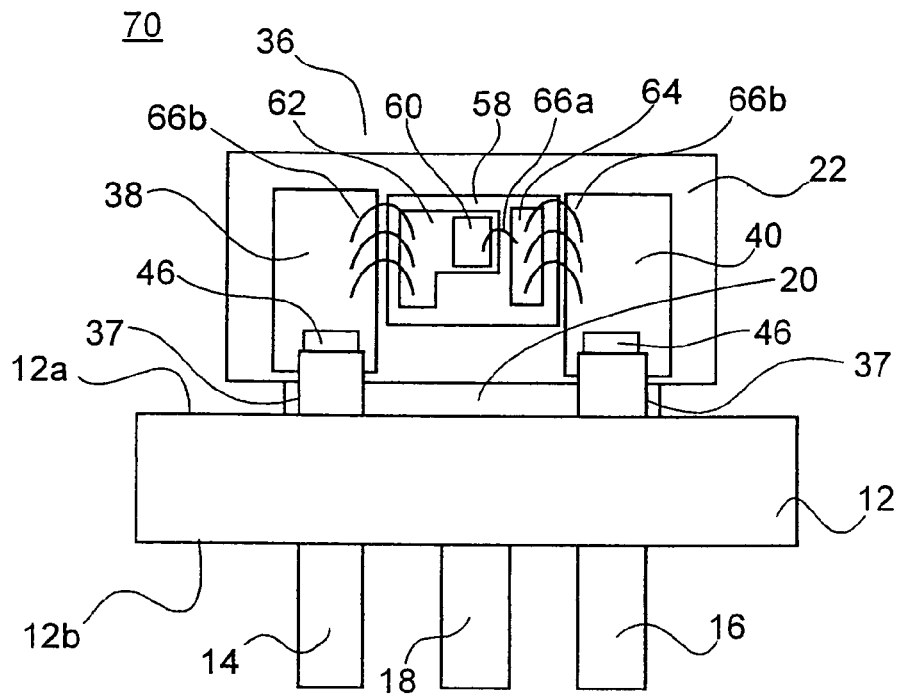
FIG. 14 is a front view of an optical semiconductor device according to one embodiment of the present invention.
Figure 15:
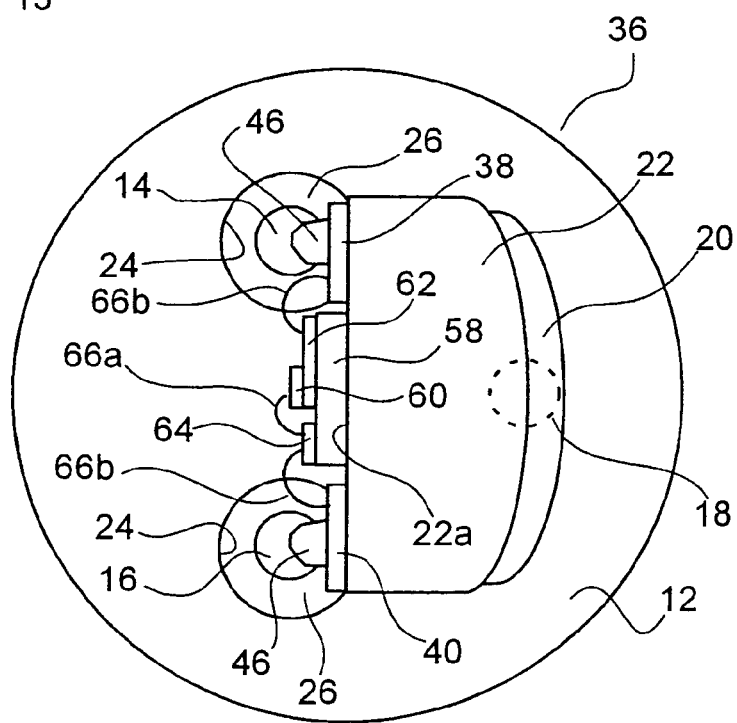
FIG. 15 is a plan view of the optical semiconductor device shown in FIG. 14.
Figure 16:
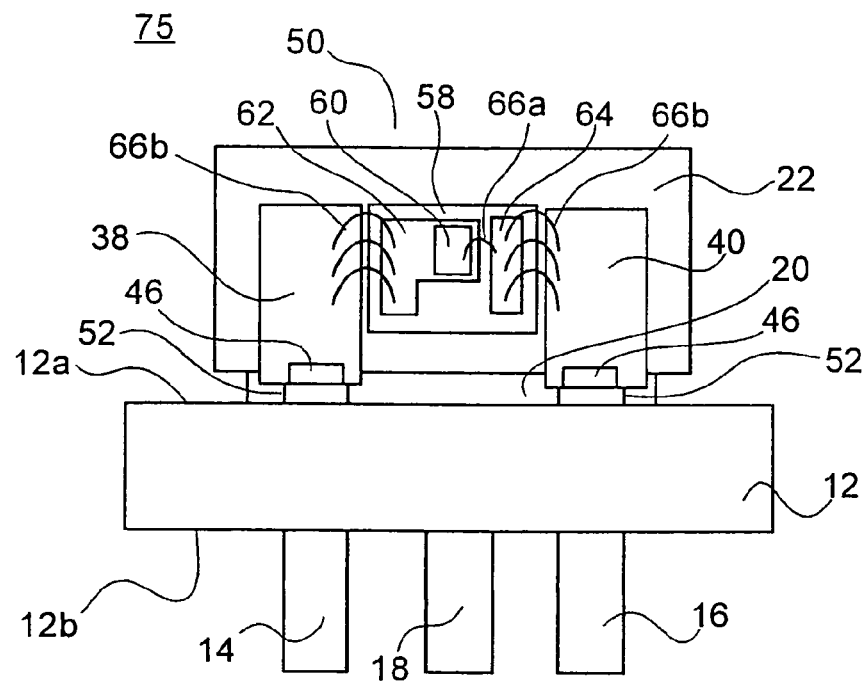
FIG. 16 is a front view of an optical semiconductor device according to one embodiment of the present invention.
Figure 17:
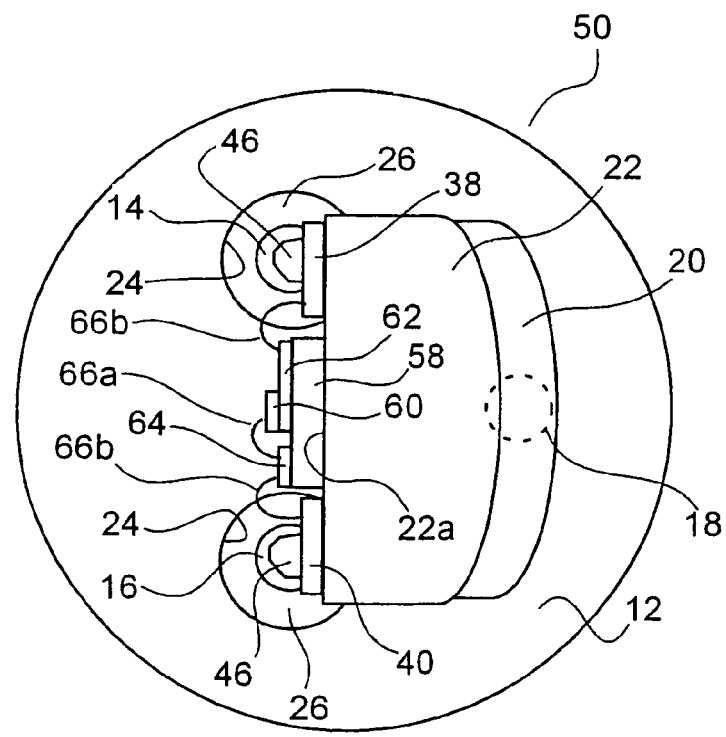
FIG. 17 is a plan view of the optical semiconductor device shown in FIG. 16.

FIG. 12 is a front view of an optical semiconductor device according to one embodiment of the present invention. FIG. 13 is a plan view of the optical semiconductor device shown in FIG. 12. FIG. 14 is a front view of an optical semiconductor device according to one embodiment of the present invention. FIG. 15 is a plan view of the optical semiconductor device shown in FIG. 14. FIG. 16 is a front view of an optical semiconductor device according to one embodiment of the present invention. FIG. 17 is a plan view of the optical semiconductor device shown in FIG. 16.

It should be noted that in the fourth embodiment, a description will hereinafter be described by giving an LD device as the optical semiconductor device as an example, any other suitable light receiving device or light emitting device may also be adopted as the optical semiconductor device In addition, while a cap for a package is disposed on the package side surface 12a of the stem for an optical element used in each of the LD devices, FIGS. 12 to 17 show a state in which the cap for the package is detached from the package side surface 12a, that is, they do not illustrate the cap.

An LD device 55 as the optical semiconductor device shown in FIGS. 12 and 13 is such that an LD chip is mounted to the stem 10 for an LD of the first embodiment.

In FIGS. 12 and 13, a sub-mount 58 is joined to an central portion of the optical element mounting surface 22a of the block 22 included in the stem 10 for an LD, i.e., a portion put between the lead electrodes 14 and 16, the central portion being located at the middle of the optical element mounting surface 22a in the height direction thereof.

A metalized pattern 62 and another metalized pattern 64 are provided on the sub-mount 58. An LD chip 60 is bonded on the metalized pattern 62 for electrical connection. In addition, the LD chip 60 is connected to the metalized pattern 64 through a wire 66a.

The sub-mount 58 is made of aluminum nitride or silicon carbide, and each of the metalized patterns 62 and 64 of the sub-mount 58 is made from an Au film by sputtering for example. The sub-mount 58 and the metalized patterns 62 and 64 constitute a high-frequency line substrate having impedance matching.

When for example, the lead electrode 14 is on a low potential side and the load electrode 16 is on a high potential side, a high potential side terminal (not shown) of the LD chip 60 provided on the sub-mount 58 and the metalized pattern 64 are connected to each other with the wire 66a as short as possible, thereby reducing the high-frequency propagation loss. In addition, a low potential electrode (not shown) of the LD chip 60 is directly and conductively bonded to the metalized pattern 62, thereby reducing the high-frequency propagation loss.

Moreover, the metalized pattern 62 and the lead electrode 14 are connected with each other through a larger number of wires 66b as short as possible, and the metalized pattern 64 and the lead electrode 16 are also connected with each other through a larger number of wires 66b as short as possible, thereby reducing the high-frequency propagation loss.

In the stem 10 for an LD, the suitable impedance matching is obtained in the lead electrodes 14 and 16 projecting from the package side surface 12a, thereby reducing the high-frequency propagation loss in the lead electrodes 14 and 16 projecting from the package side surface 12a. Thus, the LD chip 60 is connected to the lead electrodes 14 and 16 in a state of the less high-frequency propagation loss. In addition, since the inexpensive stem 10 for an LD can be provided, the LD device 55 can be constructed at low cost.

For this reason, the LD device 55 having the less high-frequency propagation loss can be constructed at low cost by using the stem 10 for an LD.

In addition, an LD device 70 as the optical semiconductor device shown in FIGS. 14 and 15 is such that an LD chip is mounted to the stem 36 for an LD of the second embodiment.

In the LD device 70 as well, the sub-mount 58 is joined to the central portion of the optical element mounting surface 22a of the block 22. The metalized pattern 62 and the metalized pattern 64 are disposed on the sub-mount 58. The LD chip 60 is conductively bonded to the sub-mount 58, and the LD chip 60 and the metalized pattern 64 are connected to each other with the wire 66a.

The high potential side terminal (not shown) of the LD chip 60 provided on the sub-mount 58, and the metallized pattern 64 are connected to each other with the wire 66a as short as possible, thereby reducing the high-frequency propagation loss. In addition, the low potential side of the LD chip 60 is directly and conductively bonded to the metalized pattern 62, thereby reducing the high-frequency propagation loss. The construction of the sub-mount 58 is the same as that of the LD device 55.

Moreover, in the LD device 70, the metalized pattern 62 and the high-frequency line substrate 38 are connected to each other with a larger number of wires 66b as short as possible, thereby further reducing the high-frequency propagation loss between the metalized pattern 62 and the lead electrode 14. In addition, the metalized pattern 64 and the high-frequency line substrate 40 are also are connected to each other with a larger number of wires 66b as short as possible, thereby further reducing the high-frequency propagation loss between the metalized pattern 64 and the lead electrode 16. In addition thereto, the high-frequency propagation loss due to the projecting portions 37 projecting from the package side surface 12a of the eyelet 12 can be stably reduced by using the stem 36 for an LD. Thus, the LD chip 60 is connected to the lead electrodes 14 and 16 in a state of the less high-frequency propagation loss. In addition, since the inexpensive stem 36 for an LD can be provided, the inexpensive LD device 70 can be constructed.

In this way, it is possible to construct the LD device 70 with a further stably reduced high-frequency propagation loss at low cost.

In addition, an LD device 75 as the optical semiconductor device shown in FIGS. 16 and 17 is such that an LD chip is mounted to the stem 50 for an LD of the third embodiment.

In the LD device 75 as well, the sub-mount 58 is joined to the central portion of the optical element mounting surface 22a of the block 22. The metalized pattern 62 and the metalized pattern 64 are disposed on the sub-mount 58. The LD chip 60 is conductively bonded to the metalized pattern 62, and the LD chip 60 and the metalized pattern 64 are connected to each other with the wire 66a.

The high potential side terminal (not shown) of the LD chip 60 provided on the sub-mount 58 and the metallized pattern 64 are connected to each other with the wire 66a as short as possible, thereby reducing the high-frequency propagation loss. In addition, the low potential side of the LD chip 60 is directly and conductively bonded to the metalized pattern 62, thereby reducing the high-frequency propagation loss. The construction of the sub-mount 58 is the same as that of the LD device 55.

Moreover, in the LD device 75 as well, the metalized pattern 62 and the high-frequency line substrate 38 are connected to each other with a larger number of wires 66b as short as possible, thereby further reducing the high-frequency propagation loss between the metalized pattern 62 and the lead electrode 14. In addition, the metalized pattern 64 and the high-frequency line substrate 40 are also are connected to each other with a larger number of wires 66b as short as possible, thereby further reducing the high-frequency propagation loss between the metalized pattern 64 and the lead electrode 16. In addition thereto, the high-frequency propagation loss due to the projecting portions 52 projecting from the package side surface 12a of the eyelet 12 can be stably reduced by using the stem 50 for an LD. Thus, the LD chip 60 is connected to the lead electrodes 14 and 16 in a state of the less high-frequency propagation loss. In addition, since the stem 50 for an LD can be provided more inexpensively than the stem 36 for an LD, the LD device 75 can be constructed more inexpensively than the LD device 70.

In this way, it is possible to construct the LD device 75 with a further stably reduced high-frequency propagation loss at low cost.

As described above, the optical semiconductor device according to the fourth embodiment of the present invention comprises: a substrate having a first principal surface and a second principal surface that are opposite with each other, a through hole perfectly extending through the first and second principal surfaces, and a base-like portion provided on one portion of the first principal surface so as to be higher than the first principal surface; a lead electrode inserted through the through hole of the substrate, and fixed to an inner surface of the through hole and sealed with an insulator, the lead electrode projecting from the first principal surface side and the second principal surface side of the substrate; a stand provided on a surface of the base-like portion of the substrate, the stand having one side face facing a side face of the lead electrode, the one side face being close to the side face of the lead electrode and projecting outward in a eaves-like shape with respect to a side face of the base-like portion; and an optical element provided on the stand, the optical element having a signal terminal connected to the lead electrode.

As a result, it is possible to provide the inexpensive optical semiconductor device having the less high-frequency propagation loss.

In addition, the optical semiconductor device according to the fourth embodiment of the present invention comprises: a substrate having a first principal surface and a second principal surface that are opposite with each other, a through hole perfectly extending through the first and second principal surfaces, and a base-like portion provided on one portion of the first principal surface so as to be higher than the first principal surface; a lead electrode inserted through the through hole of the substrate, and fixed to an inner surface of the through hole and sealed with an insulator, the lead electrode projecting from the first principal surface side and the second principal surface side of the substrate; a stand provided on a surface of the base-like portion of the substrate, the stand having one side face facing a side face of the lead electrode, the one side face being close to the side face of the lead electrode and projecting outward in a eaves-like shape with respect to a side face of the base-like portion; a high-frequency line substrate provided on the one side face of the stand, the high-frequency line substrate having a dielectric substrate, and a signal line provided on a surface of the dielectric substrate; and an optical element provided on the stand, the optical element having a signal terminal connected to the lead electrode, wherein the high-frequency line substrate is provided between the lead electrode and the stand, and wherein the lead electrode and the signal terminal are electrically connected to each other with the signal line interposed therebetween.

As a result, it is possible to provide the inexpensive optical semiconductor device having the less high-frequency propagation loss.

The test results show that the eye-pattern of the LD device according to the fourth embodiment, especially, of the LD device using the stem for an LD can provide less jitter than the eye-pattern of the conventional LD device using the conventional stem for an LD. In the stem for an LD, the lead electrodes 14 and 16 which project from the package side surface 12a of the eyelet 12 are connected to the high-frequency line substrates 38 and 40, respectively, by solder. On the other hand, the conventional stem for an LD does not include the base-like portion 20 on the package side surface 12a of the eyelet 12. Consequently, the LD device according to the fourth embodiment of the present invention can provide a transmission distance longer than that of the conventional LD device.

It should be noted that while the description has been given so far by giving the LD device as an example, the same effects can be obtained even in other light emitting devices or light receiving devices.

As set forth hereinabove, the stem for an optical element and the optical semiconductor device according to the present invention are suitable for the stem for an optical element used in the optical communication or the like, and the optical semiconductor device using the same.

While the presently preferred embodiments of the present invention have been shown and described. It is to be understood these disclosures are for the purpose of illustration and that various changes and modifications may be made without departing from the scope of the invention as set forth in the appended claims.

What is claimed is:

1. A stem for an optical element, comprising:
a substrate having a first and second principal surfaces that are opposite each other, a through hole extending through the first and second principal surfaces, and a base-like portion, located on a first portion of the first principal surface, and projecting outward from the first principal surface;
a lead electrode inserted through the through hole of the substrate, fixed within the through hole and sealed to the substrate with an insulator, the lead electrode projecting from the first principal surface and the second principal surface of the substrate;
a stand located on a surface of the base-like portion of the substrate, the stand having a first side face facing a side face of the lead electrode, the first side face being close to the side face of the lead electrode and projecting outward and overhanging a side face of the base-like portion; and
a high-frequency line substrate located on the first side face of the stand, the high-frequency line substrate including a dielectric substrate and a metal film signal line on a surface of the dielectric substrate, wherein
the lead electrode projects beyond the first principal surface of the substrate to a position below a center of the stand and above the base-like portion,
the high-frequency line substrate is sandwiched between the lead electrode and the stand, and
the side face of the lead electrode directly contacts the metal film signal line.

2. An optical semiconductor device, comprising:
a substrate having first and second principal surfaces that are opposite each other, a through hole extending through the first and second principal surfaces, and a base-like portion, located on a first portion of the first principal surface, and projecting outward from the first principal surface;

a lead electrode inserted through the through hole of the substrate, fixed within the through hole and sealed to the substrate with an insulator, the lead electrode projecting from the first principal surface and the second principal surface of the substrate;

a stand located on a surface of the base-like portion of the substrate, the stand having a first side face facing a side face of the lead electrode, the first side face being close to the side face of the lead electrode and overhanging a side face of the base-like portion;

a high-frequency line substrate located on the first side face of the stand, the high-frequency line substrate including a dielectric substrate and a metal film signal line on a surface of the dielectric substrate; and an optical element located on the stand, the optical element having a signal terminal connected to the lead electrode, wherein the lead electrode projects beyond the first principal surface of the substrate to a position below a center of the stand and above the base-like portion, the high-frequency line substrate is sandwiched between the lead electrode and the stand, the side face of the lead electrode directly contacts the metal film signal line, and the lead electrode and the signal terminal are electrically connected to each other by the metal film signal line.

3. A stem for an optical element, comprising:

a substrate having a first and second principal surfaces that are opposite each other, a through hole extending through the first and second principal surfaces, and a base-like portion, located on a first portion of the first principal surface, and projecting outward from the first principal surface;

a lead electrode inserted through the through hole of the substrate, fixed within the through hole and sealed to the substrate with an insulator, the lead electrode projecting from the first principal surface and the second principal surface of the substrate;

a stand located on a surface of the base-like portion of the substrate, the stand having a first side face facing a side face of the lead electrode, the first side face being close to the side face of the lead electrode and projecting outward and overhanging a side face of the base-like portion;

a high-frequency line substrate located on the first side face of the stand, the high-frequency line substrate including a dielectric substrate and a metal film signal line located on a surface of the dielectric substrate; and an electrically conductive connecting material on a top surface of the lead electrode electrically connecting the metal film signal line to the lead electrode.

4. The stem for an optical element according to claim 3, wherein the lead electrode projects from the principal surface of the substrate to a position below the base-like portion.

5. An optical semiconductor device, comprising:

a substrate having a first and second principal surfaces that are opposite each other, a through hole extending through the first and second principal surfaces, and a base-like portion, located on a first portion of the first principal surface, and projecting outward from the first principal surface;

a lead electrode inserted through the through hole of the substrate, fixed within the through hole and sealed to the substrate with an insulator, the lead electrode projecting from the first principal surface and the second principal surface of the substrate;

a stand located on a surface of the base-like portion of the substrate, the stand having a first side face facing a side face of the lead electrode, the first side face being close to the side face of the lead electrode and projecting outward and overhanging a side face of the base-like portion;

a high-frequency line substrate located on the first side face of the stand, the high-frequency line substrate including a dielectric substrate and a metal film signal line located on a surface of the dielectric substrate;

an optical element located on the stand, the optical element having a signal terminal connected to the lead electrode; and an electrically conductive connecting material on a top surface of the lead electrode electrically connecting the metal film signal line to the lead electrode, wherein the lead electrode and the signal terminal are electrically connected to each other by the metal film signal line.

6. The optical semiconductor device according to claim 5, wherein the lead electrode projects from the principal surface of the substrate to a position below the base-like portion.

* * * * *